(12) United States Patent
Czech

(10) Patent No.: US 6,242,109 B1
(45) Date of Patent: Jun. 5, 2001

(54) HIGH-TEMPERATURE-RESISTANT COMPONENT AND METHOD OF PROVIDING PROTECTION THEREOF AGAINST OXIDATION

(75) Inventor: Norbert Czech, Dorsten (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/494,773

(22) Filed: Jan. 31, 2000

Related U.S. Application Data

(63) Continuation of application No. PCT/DE98/02036, filed on Jul. 20, 1998.

(30) Foreign Application Priority Data

Jul. 31, 1997 (DE) .............................. 197 33 146

(51) Int. Cl.[7] .............................. B32B 9/00; B32B 15/00
(52) U.S. Cl. .................... 428/615; 428/642; 428/680; 428/681; 428/469
(58) Field of Search ................ 428/615, 623, 428/629, 632, 642, 668, 678, 679, 680, 681, 469; 416/241 R; 420/435, 441, 555, 650

(56) References Cited

U.S. PATENT DOCUMENTS 4,297,150 * 10/1981 Foster et al. .......................... 148/6.3
5,805,973 * 9/1998 Coffinberry et al. ................ 428/551

FOREIGN PATENT DOCUMENTS

0607651 * 7/1994 (EP) .
0846788 * 6/1998 (EP) .

* cited by examiner

Primary Examiner—Deborah Jones
Assistant Examiner—Bryant Young
(74) Attorney, Agent, or Firm—Herbert L. Lerner; Laurence A. Greenberg; Werner H. Stemer

(57) ABSTRACT

The invention relates to a high-temperature-resistant component comprising a nickel-based or cobalt-based superalloy, in particular having a protective alloy selected from the class consisting of MCrAlY alloys. The component has an antioxidation coating comprising gallium. The invention also relates to a corresponding method of providing protection against oxidation.

14 Claims, 3 Drawing Sheets

HIGH-TEMPERATURE-RESISTANT COMPONENT AND METHOD OF PROVIDING PROTECTION THEREOF AGAINST OXIDATION

CROSS-REFERENCE TO RELATED APPLICATION

This is a continuation of copending International Application PCT/DE98/02036, filed Jul. 20, 1998, which designated the United States.

BACKGROUND OF THE INVENTION:

Field of the Invention

The invention relates to a high-temperature-resistant component and a method of protecting a high-temperature-resistant component against oxidation.

U.S. Pat. No. 4,321,310 describes a composite coating system for protecting a metallic component, in particular at high temperatures. In particular, a coating system for a gas turbine blade is described. A gas turbine blade is subjected to great stresses by high temperatures and strong oxidation. In order to be able to withstand the high temperatures, gas turbine blades are frequently made of a nickel-based or cobalt-based superalloy which has a sufficiently high melting point. In general, it is also necessary to protect the surface of such a gas turbine blade against oxidation. This can be achieved by means of an MCrAlY coating. Here, M is at least one of the elements iron, cobalt or nickel, Cr is chromium, Al is aluminum and Y is yttrium. Oxidation protection is achieved by a very oxidation-resistant aluminum oxide being formed on the surface of such a coating. In the document cited, such a coating on a gas turbine blade is additionally provided with a ceramic coating. This ceramic coating acts as a thermal barrier layer. Between the thermal barrier layer and the oxidation layer, there is arranged an aluminum layer. This improves, in particular, the adhesion of the ceramic layer to the antioxidation layer.

WO 97/07252 describes a product for conducting a hot, oxidizing gas. In particular, this is a highly thermally stressed component of a gas turbine.

It is stated that the oxidation resistance of metallic protective layers comprising MCrAlY is impaired over the course of time by the protective layer being continuously depleted in aluminum. Such depletion occurs as a result of the oxide film being continually worn away during use of the component and aluminum continuously diffusing from the protective layer to the surface. Accordingly, the maximum life of a protective layer depends on its aluminum content. A high proportion by weight of aluminum in an alloy for a protective layer is therefore desirable in the interests of longevity. However, a high proportion by weight of aluminum leads to embrittlement of the alloy. This is because the aluminum is not present in elemental form in the alloy, but at least a significant proportion of it is in the form of intermetallic compounds, in particular intermetallic compounds of nickel and alumium or cobalt and aluminium. Different properties, in particular different coefficients of thermal expansion, of these intermetallic compounds result in the embrittlement mentioned. This greatly restricts the proportion by weight of aluminium in the protective layer. It is stated that alloying of gallium into the protective layer ensures the desired oxidation resistance, with the alloying-in of gallium simultaneously leading to an improvement in the ductility of the protective layer, i.e. the brittleness of the protective layer is reduced.

SUMMARY OF THE INVENTION

It is accordingly an object of the invention to provide a high-temperature-resistant component that overcomes the above-mentioned disadvantages of the prior art devices and methods of this general type. It is a further object of the invention to provide a method of protecting a high-temperature-resistant component against oxidation.

With the foregoing and other objects in view, there is provided, according to the invention, a high-temperature-resistant and oxidation-resistant component comprising a nickel-based or cobalt-based superalloy base material and a gallium-based antioxidation coating.

The term "gallium-based" means that the antioxidation coating consists predominantly of gallium, i.e. pure gallium or gallium containing a minor amount of aluminum. The antioxidation coating does not have to cover the entire component; it is also possible for only one region of the component or a plurality of regions of the component to be coated. Such an antioxidation coating affords a resistance to oxidation at least comparable with that of an aluminum layer since gallium forms a very resistant oxide which effectively protects material located under this oxide layer. In particular, an antioxidation coating based on gallium has the advantage that it does not significantly embrittle an underlying base material containing iron, cobalt or nickel. From an antioxidation coating based on aluminum, aluminum would diffuse into such a base material also known as alitizing. This would result in the formation of intermetallic phases whose brittleness, as mentioned above, would lead to considerable embrittlement of the base material.

Gallium also diffuses into the base material. However, the intermetallic phases formed thereby are significantly more ductile than analogous intermetallic phases with aluminum instead of gallium. Accordingly, an antioxidation coating based on gallium leads to significantly lower embrittlement which is controllable in the layer properties.

Preferably, an antioxidation coating comprising gallium and a protective alloy selected from the class consisting of MCrAlY alloys, where a) M is at least one metal selected from the group consisting of nickel, cobalt and iron,
b) Cr is chromium,
c) Al is aluminum and
d) Y is a metal selected from the group consisting of yttrium, scandium, lanthanum and cerium, are applied to the base material. The protective alloy can be applied to the base material and the antioxidation coating can be applied to the protective alloy.

When such an antioxidation coating is based on aluminum, it is likely to cause embrittlement by formation of intermetallic phases containing aluminum. The improved oxidation protection provided by application of aluminium generally leads, therefore, to a barely controllable susceptibility to cracking in the protective layer. Accordingly, for example, gas turbine blades which have such a protective alloy, can only be provided with additional oxidation protection by application of aluminum with great difficulty, if at all. Such protective alloys have to be screened by means of complicated coverings from an application of an aluminum layer carried out on the other blade, or have to be freed of aluminum by subsequent, expensive machining. Applying gallium instead of aluminum allows these protective alloys to be provided with additional oxidation protection without being unduly embrittled. A zone of an intermetallic phase comprising gallium, nickel and/or cobalt is preferably present adjacent to the antioxidation coating.

Further preference is given to the component being a part of a gas turbine unit, in particular a gas turbine blade, or an element for a combustion chamber lining. It is just such components of a gas turbine unit which are subjected to very high temperatures of the order of 600–1400° C. and correspondingly severe oxidation. Reliable and long-lived oxidation protection is a key property for such components.

In a particularly preferred embodiment, the component is a gas turbine blade of a stationary gas turbine or a gas turbine blade of an aircraft engine.

The gas turbine blade preferably has a cooling channel with a cooling channel wall which is provided at least in part with the antioxidation coating. Gas turbine blades are frequently cooled. This cooling is generally achieved by the gas turbine blade being provided with an internal cooling structure comprising a multiplicity of cooling channels through which a cooling gas, e.g. air, is conveyed. These cooling channels are also subjected to oxidation which can be considerably reduced by means of an effective and long-lived antioxidation coating based on gallium according to this invention.

With the foregoing and other objects in view, there is also provided, according to the invention, a method of protecting a high-temperature-resistant component, in particular a gas turbine blade, made of a nickel-based or cobalt-based superalloy as base material against oxidation, wherein gallium is applied to the component to form an antioxidation coating. The thickness of the resulting antioxidation coating comprising gallium can range from 0.1 micron to 10 microns.

The advantages of such a method correspond to the above statements regarding the advantages of the antioxidation coating based on gallium for a high-temperature-resistant component.

Preference is given to applying an antioxidation coating comprising gallium as well as a protective alloy comprising an MCrAlY alloy, where
a) M is at least one metal selected from the group consisting of nickel,
cobalt and iron,
b) Cr is chromium,
c) Al is aluminum and
d) Y is a metal selected from the group consisting of yttrium, scandium, lanthanum and cerium,
to the base material. The antioxidation coating can be applied to this protective alloy.

In a preferred embodiment, the component is exposed to a gallium halide gas at high temperatures, with gallium resulting from the decomposition of the gallium halide being deposited on the component. Such a method makes it possible, in a simple manner, to apply gallium uniformly from the gas phase to the surface of the component to form an antioxidation coating. Suitable high temperatures range from 600 to 1400° C. The method can be carried out in an oxygen-containing atmosphere such as air and in an inert atmosphere such as nitrogen, argon, or hydrogen.

The component is preferably a gas turbine blade having a cooling channel through which a gallium halide gas is conveyed at high temperatures and gallium is deposited from this gas onto the channel wall of the cooling channel. This method has, in particular, the advantage of uniformly providing a cooling channel of a gas turbine blade with an antioxidation coating. A corresponding method in which aluminium is applied as antioxidation coating to the cooling channel wall has the disadvantage that a high proportion of aluminum is prematurely deposited on entry of the gas into the cooling channel, so that only little aluminum reaches the regions of the channel wall which are located further back. This is due to a relatively high diffusion coefficient for aluminum in a superalloy. In contrast, gallium has a lower diffusion in a superalloy and is accordingly distributed more uniformly on the cooling channel wall.

Other features which are considered as characteristic for the invention are set forth in the appended claims.

Although the invention is illustrated and described herein as embodied in a high-temperature-resistant and oxidation-resistant component and method of providing protection against oxidation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical reference numerals have identical meanings in the various figures.

DESCRIPTION OF THE PREFERRED EMBODIMENTS

Figure 1:
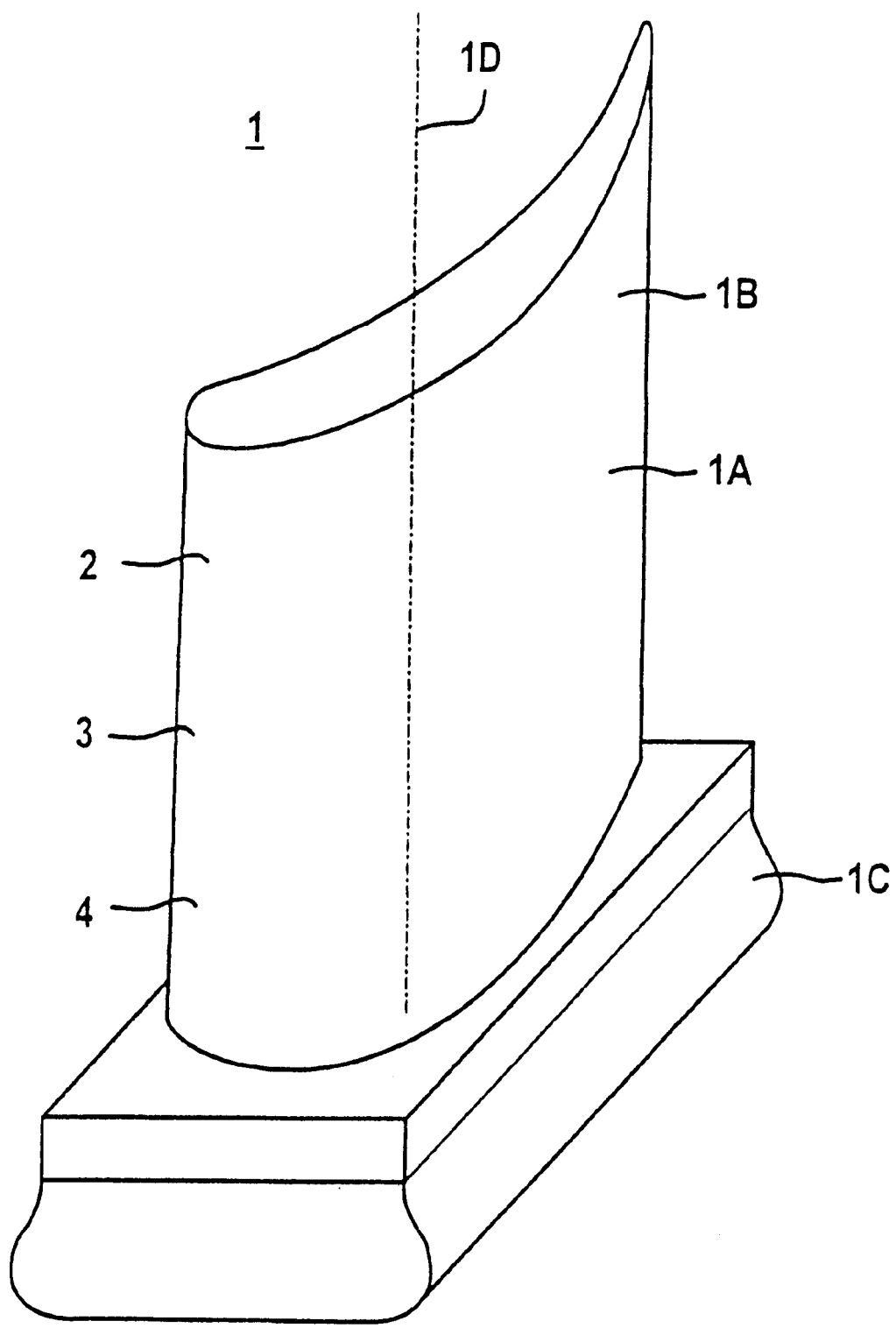
FIG. 1 shows a gas turbine blade.

FIG. 1 shows a component which is a gas turbine blade 1. It has a vane 1B aligned along an axis 1D. The vane 1B adjoins a root section 1C. The blade 1 is made of a base material 2. This base material 2 is a nickel-based or cobalt-based superalloy. The blade 1 has a blade surface 1A with a coating which is explained in more detail with the aid of FIG. 2.

Figure 2:
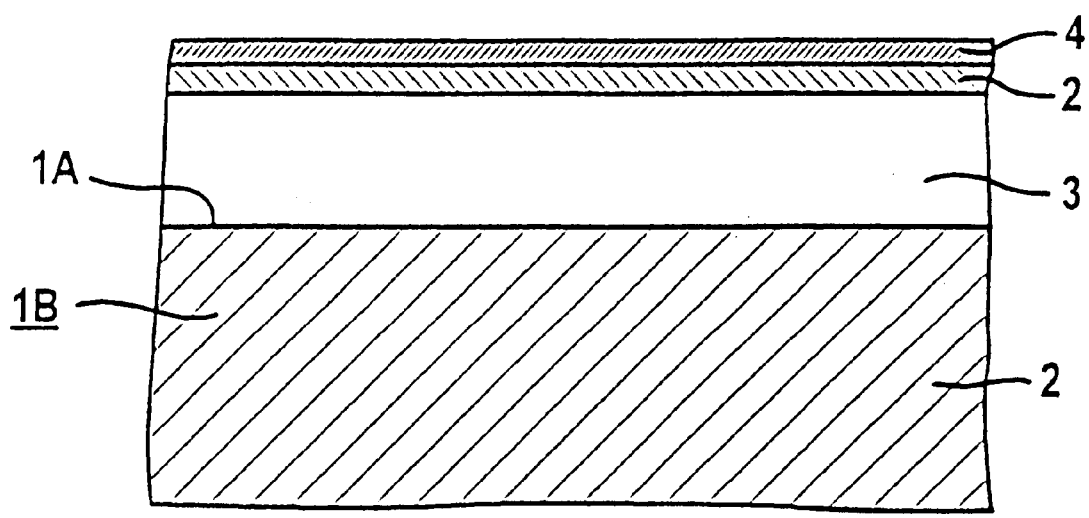
FIG. 2 shows a part of a cross-section through a gas turbine blade.

FIG. 2 shows part of a cross-section through the vane 1B of FIG. 1. A protective alloy 3 is applied to the surface 1A of the base material 2. This protective alloy 3 comprises an alloy of the type MCrAlY, where M is a metal selected from the group consisting of iron, cobalt and nickel. Cr is chromium and Al is aluminum. Y is yttrium and can also be replaced completely or partially by scandium, lanthanum or cerium. An antioxidation coating 4 based on gallium is applied to the protective alloy 3. The antioxidation coating 4 is preferably an essentially pure gallium layer. The gallium diffuses from the antioxidation coating 4 into the protective alloy 3. Within a zone 8, it forms intermetallic compounds with the nickel or the cobalt of the protective alloy 3. However, in contrast to an antioxidation coating 4 comprising aluminum, this does not lead to excessive embrittlement of the protective layer 3 since these intermetallic compounds result in a higher ductility of the zone 8.

Figure 3:
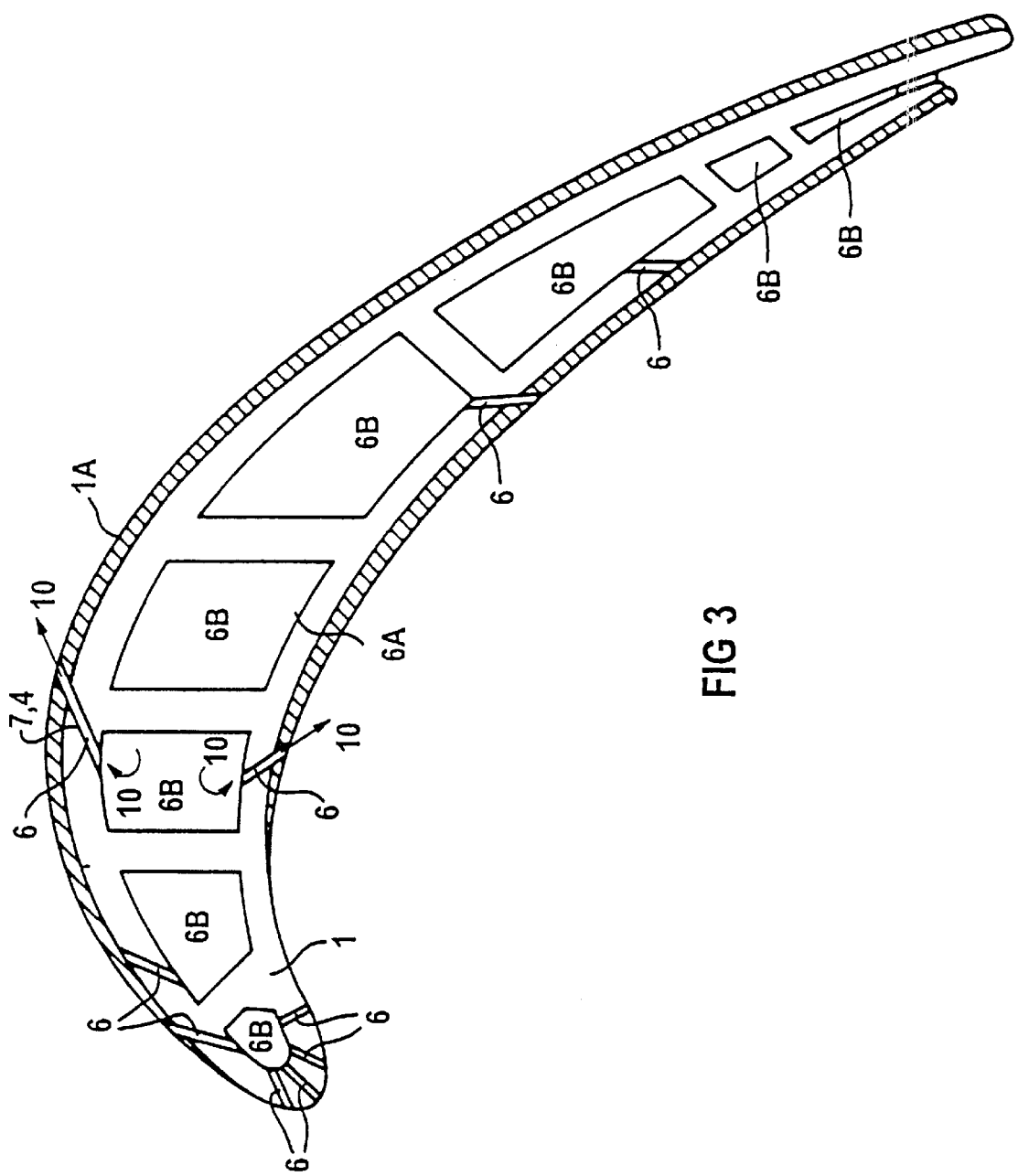
FIG. 3 shows a cross-section through a gas turbine blade having a cooling structure.

FIG. 3 shows a cross-section through a gas turbine blade 1. The gas turbine blade 1 has a cooling structure 6A. This consists essentially of hollow spaces 6B from which cooling channels 6 lead to the surface 1A of the gas turbine blade 1. The cooling channels 6 of the gas turbine blade 1 each have a channel wall 7. In order to make these channel walls 7 more resistant to oxidation, a gallium halide gas 10 is injected at high temperatures into the cooling structure 6A of the gas turbine blade 1. Gallium is deposited from this hot gas 10 onto the cooling channel walls 7. A reliable and long-lived antioxidation coating 4 is thus produced. In contrast to a corresponding method using aluminum, a more uniform coating of the cooling channel walls 7 can be obtained by means of gallium since gallium diffuses less quickly into the superalloy 2. Of course, all walls of the cooling structures 6A, i.e. the walls of the hollow spaces 6B too, can be provided with the antioxidation coating 4.

Figure 4:
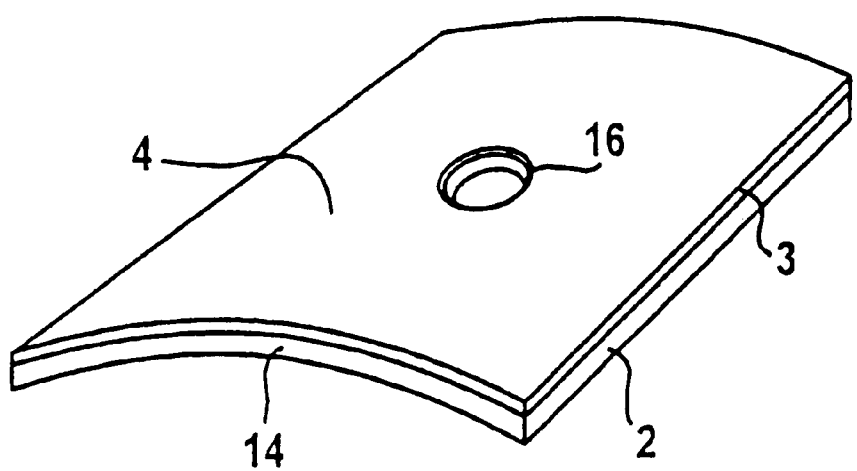
FIG. 4 shows a heat shield for a combustion chamber lining.

FIG. 4 shows an element 14 which is a heat shield for a combustion chamber lining. An MCrAlY protective alloy 3 is applied to a base material 2. The former is provided with an antioxidation coating 4 comprising gallium. The opening 16 serves to fasten the element 14 to the combustion chamber lining.

I claim:

1. A high-temperature-resistant and oxidation-resistant component comprising a nickel-based or cobalt-based superalloy as base material and a gallium-based antioxidation coating predominantly comprising gallium in a form selected from the group consisting of pure gallium, an intermetallic compound of gallium, a gallium halide, and decomposition products of gallium halides.

2. The component according to claim 1, in which gallium is present as pure gallium.

3. The component according to claim 1, in which gallium is present as an intermetallic compound.

4. The component according to claim 1, in which gallium is present as a halide.

5. The component according to claim 1, in which the thickness of the antioxidation coating ranges from 0.1 to 10 microns.

6. The component according to claim 1, in which the antioxidation coating additionally comprises a minor amount of aluminum.

7. The component according to claim 1, additionally comprising a protective alloy selected from the group consisting of MCrAlY alloys, where
   a) M is at least one metal selected from the group consisting of nickel, cobalt and iron,
   b) Cr is chromium,
   c) Al is aluminum and
   d) Y is a metal selected from the group consisting of yttrium, scandium, lanthanum and cerium.

8. The component according to claim 7, in which said protective alloy is applied to the base material, and said antioxidation coating is applied to said protective alloy.

9. The component according to claim 7, wherein a zone of an intermetallic phase comprising gallium, nickel and/or cobalt is present between said antioxidation coating and said protective alloy.

10. The component according to claim 1, which is a part of a gas turbine unit.

11. The component according to claim 10, in which said gas turbine is a gas turbine blade or an element for a combustion chamber lining.

12. The component according to claim 10, which is a gas turbine blade of a stationary gas turbine.

13. The component according to claim 10, which is a gas turbine blade of an aircraft engine.

14. The component according to claim 10 having a cooling channel with a cooling channel wall, in which said antioxidation coating is applied at least in part to said cooling channel wall.

* * * * *